United States Patent [19]
Akimoto

[11] Patent Number: 5,972,110
[45] Date of Patent: Oct. 26, 1999

[54] RESIST PROCESSING SYSTEM

[75] Inventor: Masami Akimoto, Kumamoto, Japan

[73] Assignee: Tokyo Electron Limited, Tokyo, Japan

[21] Appl. No.: 08/921,716

[22] Filed: Sep. 2, 1997

[30] Foreign Application Priority Data

Sep. 6, 1996 [JP] Japan .................................. 8-257596

[51] Int. Cl.⁶ .................................................. B05C 5/00
[52] U.S. Cl. ........................... 118/52; 118/58; 118/66; 118/69; 118/500; 118/319; 118/320; 414/222; 414/225; 414/935; 414/937; 414/941
[58] Field of Search ................................ 118/52, 58, 66, 118/69, 500, 319, 320; 414/222, 225, 935, 937, 941

[56] References Cited

U.S. PATENT DOCUMENTS

| | | | |
|---|---|---|---|
| 5,297,910 | 3/1994 | Yoshioka et al. | 414/935 |
| 5,620,560 | 4/1997 | Akimoto et al. | 156/345 |
| 5,639,301 | 6/1997 | Sasada et al. | 414/937 |
| 5,779,799 | 7/1998 | Davis | 118/52 |

FOREIGN PATENT DOCUMENTS

| | | |
|---|---|---|
| 0 435 568 | 7/1991 | European Pat. Off. . |
| 0 634 699 | 1/1995 | European Pat. Off. . |
| 4-85812 | 3/1992 | Japan . |
| 2217107 | 10/1989 | United Kingdom .................... 414/935 |

OTHER PUBLICATIONS

Patent Abstracts of Japan, vol. 94, JP 06–163392, Jun. 10, 1994.

*Primary Examiner*—Laura Edwards
*Attorney, Agent, or Firm*—Oblon, Spivak, McClelland, Maier & Neustadt, P.C.

[57] ABSTRACT

A resist processing system includes a plurality of processing units each having a plurality of compartments stacked one upon the other in a vertical direction, a solution processing device arranged in a compartment positioned in a lower portion of the processing unit for applying a process solution to a substrate W while rotating the substrate, a heating device arranged in a compartment positioned in an upper portion of the processing unit for heating the substrate, a cooling device arranged in an intermediate compartment positioned between the compartment having the heating device arranged therein and the compartment having the solution processing device arranged therein for cooling the substrate, and a main arm mechanism arranged in each of the processing units and provided with a plurality of holders for transferring the substrate W into and out of each compartment, the holder being movable into and out of each of the compartments included in the processing unit, movable in a Z-axis direction, and swingable about the Z-axis by an angle θ.

19 Claims, 7 Drawing Sheets

RESIST PROCESSING SYSTEM

BACKGROUND OF THE INVENTION

The present invention relates to a resist processing system for processing a substrate such as a semiconductor wafer with resist.

Figure 1:
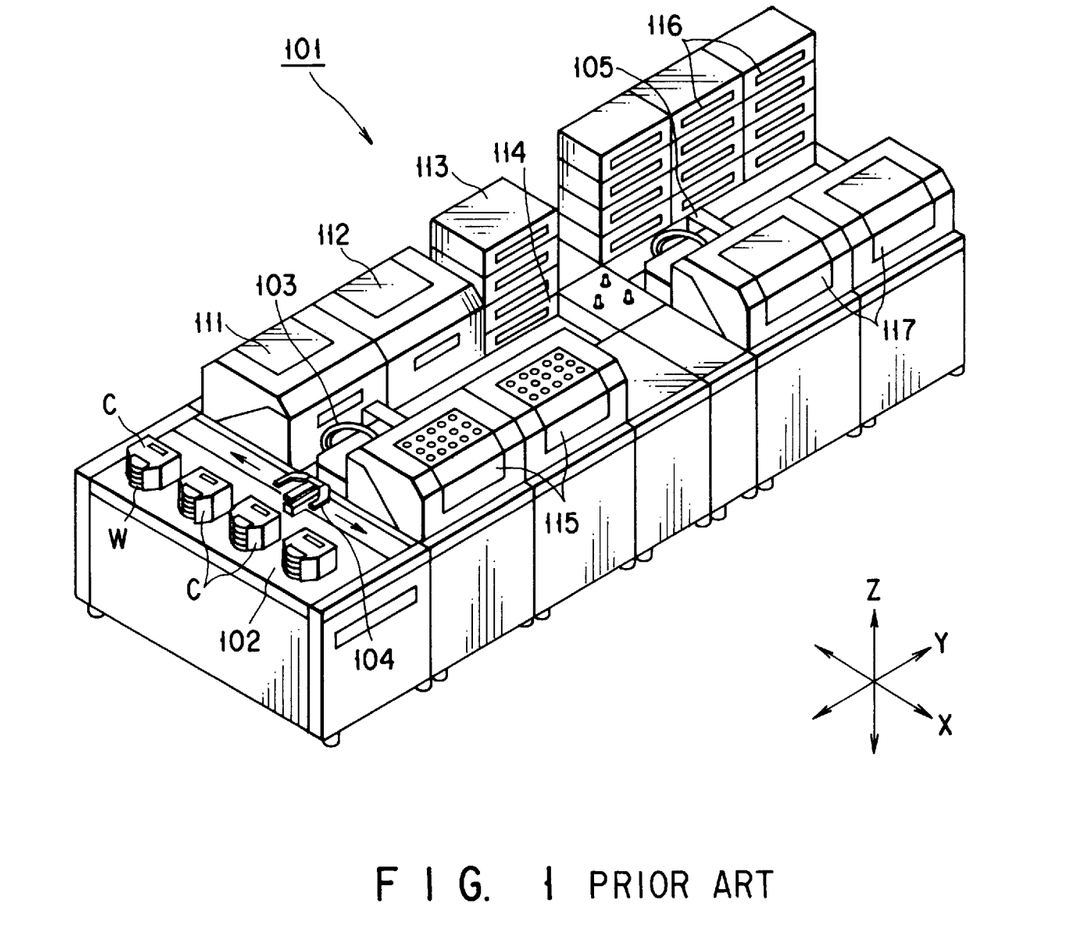
FIG. 1 is an oblique view schematically showing the outer appearance of a conventional resist processing system.

In the photolithography process employed in the manufacture of a semiconductor device, the surface of a semiconductor wafer is washed, followed by coating the washed surface with a resist and subsequently exposing selectively the coated resist layer to light. Finally, the light-exposed pattern is developed. FIG. 1 shows a conventional resist processing system 101 used for performing these treatments. The conventional system 101 comprises a load/unload section and a process section. As shown in the drawing, a cassette table 102 and a sub-arm mechanism 104 are arranged in the load/unload section. Wafers W, which are taken out of a cassette C arranged in the load/unload section, are transferred by main arm mechanisms 103 and 105 into each of the processing devices arranged within the process section.

Arranged side by side within the process section are a brush washing device 111, a high pressure jet water washing device 112, an adhesion device 113, a cleaning device 114, a resist coating device 115, a baking device 116 and a developing device 117. In each of these brush washing device 111, high pressure jet water washing device 112, resist coating device 115, and developing device 117, the wafer W is processed with a processing solution. On the other hand, a heat treatment for heating or cooling the wafer W is performed in each of these adhesion device 113, cleaning device 114, and baking device 116.

In the conventional resist processing system 101, many processing devices are arranged side by side, with the result that the system 101 occupies a large area within a clean room. It follows that the total floor area of the clean room is enlarged, leading to an excessively heavy load applied to an air conditioner. Naturally, it is desirable to decrease the floor area of the resist processing system itself.

It should also be noted that, in the conventional system 101, the solution processing type devices 111, 112, 115, 117 are positioned apart from the heat-treating type devices 113, 114, 116 so as to suppress the thermal effect imparted to the processing with a solution. As a result, the moving distance of the main arm mechanisms 103, 105 is increased in the wafer transfer step, leading to an increase in the time required for the wafer transfer.

Further, each of the main arm mechanisms 103 and 105 is frequently moved in directions of X-, Y- and Z-axes and is swung about the Z-axis, with the result that particles are generated within the resist processing system in an amount that cannot be neglected. Of course, it is of high importance in this technical field to take appropriate measures for suppressing the particle generation within the resist processing system.

BRIEF SUMMARY OF THE INVENTION

An object of the present invention is to provide a resist processing system which permits diminishing its occupying space, achieving a high through-put, and suppressing the particle generation.

According to a preferred embodiment of the present invention, there is provided a resist processing system, comprising:

- a plurality of processing units each having a plurality of compartments stacked one upon the other in a vertical direction;
- a solution processing device arranged in a compartment positioned in a lower portion of the processing unit for applying a process solution to a substrate while rotating the substrate;
- a heating device arranged in a compartment positioned in an upper portion of the processing unit for heating the substrate;
- a cooling device arranged in an intermediate compartment positioned between the compartment having the heating device arranged therein and the compartment having the solution processing device arranged therein for cooling the substrate; and
- a main arm mechanism arranged in each of the processing units and provided with a plurality of holders for transferring the substrate into and out of each compartment, the holder being movable into and out of each of the compartments included in the processing unit, movable in a Z-axis direction, and swingable about the Z-axis by an angle θ.

In the present invention, the heat-treating type devices, i.e., baking device, adhesion device and cooling device, are stacked on the solution processing type devices, i.e., resist coating device, developing device and washing device, as described above, leading to a shortened moving distance of the main arm mechanism. As a result, the time required for moving the main arm mechanism is shortened in the substrate transferring step. Also, the main arm mechanism can be moved in directions of X- and Z-axes alone and can be swung about the Z-axis. In other words, the main arm mechanism need not be moved in a Y-direction, though the main arm mechanism in the conventional system is required to be moved in directions of X-, Y- and Z-axes. It follows that the particle generation can be suppressed in the present invention, compared with the conventional system. Further, the cooling device is arranged intermediate between the solution treating device and the heating device, with the result that a thermal effect is hardly given from the heating device to the solution treating device. Still further, it is possible to diminish the area occupied by the resist processing system in a clean room.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Let us describe preferred embodiments of the present invention with reference to the accompanying drawings. The resist processing system in each of these embodiments covers the case where semiconductor wafers are washed, coated with resist, heated, and developed.

Figure 2:
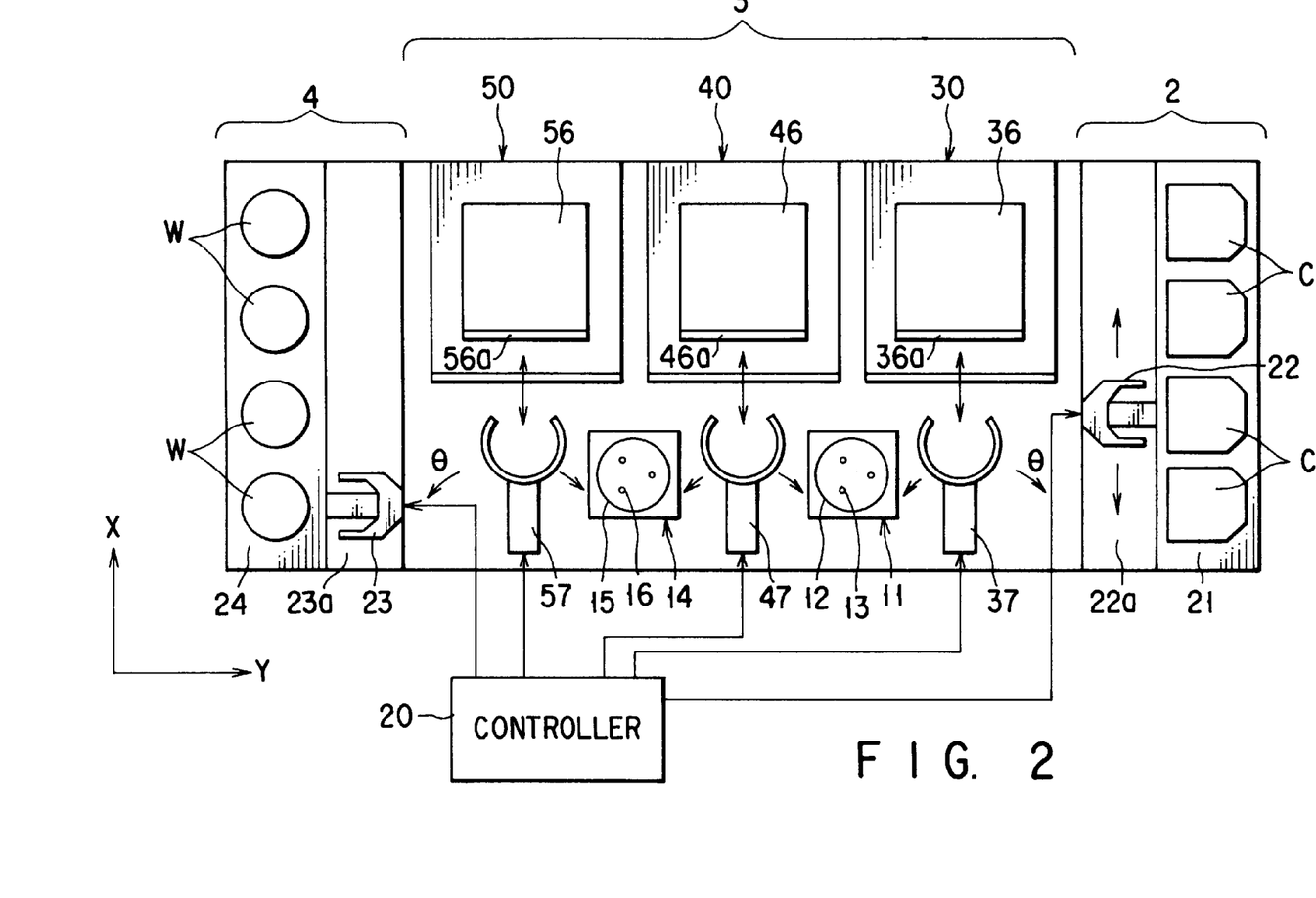
FIG. 2 is a plan view schematically showing the construction of the resist processing system according to a first embodiment of the present invention.

Specifically, FIG. 2 schematically shows the construction of the resist processing system 1 according to a first embodiment of the present invention. As shown in the drawing, the system 1 comprises a load/unload section 2, a process section 3, and an interface section 4. Wafer cassettes C are transferred by a transfer robot (not shown) into and out of the load/unload section 2. Arranged in the process section 3 are first, second and third processing units 30, 40, 50 and first, second and third main arm transfer mechanisms 37, 47, 57. Further, an exposure device (not shown) for exposing light to a resist-coated wafer W is arranged adjacent to the interface section 4.

A cassette table 21 and a first sub-arm mechanism 22 are arranged in the load/unload section 2. Four cassettes C each housing a plurality of wafers W are disposed on the cassette table 21 such that these cassettes C are arranged side by side in an X-axis direction. The first sub-arm mechanism 22 equipped with a holder for holding the wafer W can be moved along a passageway 22a extending in the X-axis direction. The first sub-arm mechanism 22 is also equipped with an alignment mechanism (not shown) for aligning the position of the wafer W relative to the process section 3.

A second sub-arm mechanism 23, which is substantially equal to the first sub-arm mechanism 22, and a wafer table 24 are arranged in the interface section 4. The second sub-arm mechanism 23 can be moved along a passageway 23a extending in an X-axis direction so as to transfer and receive the wafer W onto and from the third main arm mechanism 57, respectively. The wafer W is transferred into and out of the exposure device (not shown) via the interface section 4. The operation of each of these main arm mechanisms 37, 47, 57 and sub-arm mechanisms 22, 23 is controlled by a controller 20.

Figure 3:
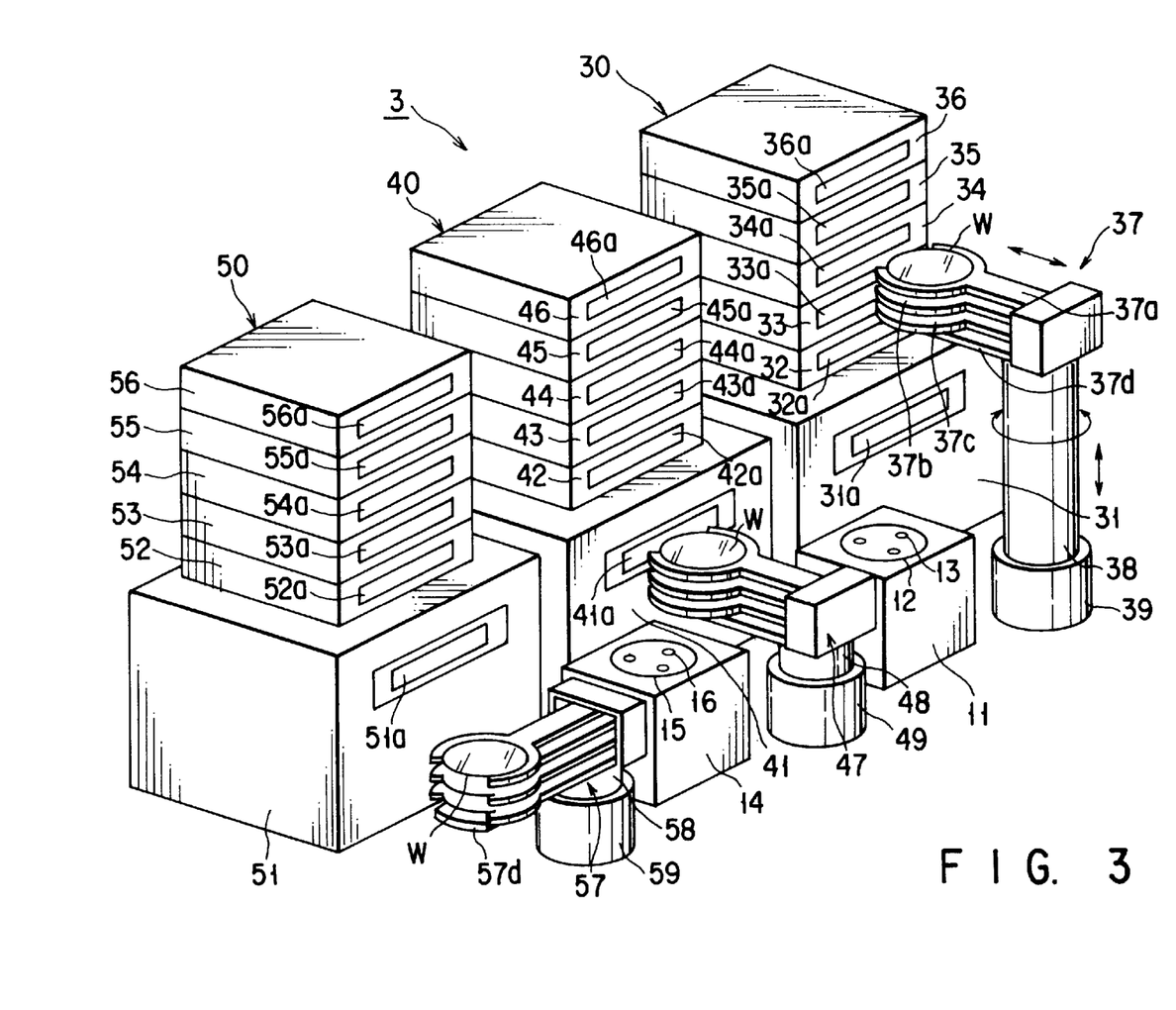
FIG. 3 is an oblique view showing the construction of the process section included in the resist processing system of the present invention shown in FIG. 2 (first embodiment)

As shown in FIG. 3, three processing units 30, 40, 50 are arranged side by side within the process section 3. Each of these processing units 30, 40, 50 includes six compartments vertically stacked one upon the other. Housed in these compartments are various processing devices such as a washing device 31, a resist coating device 41, a developing device 51, baking devices 35, 36, 45, 46, 55, 56, cleaning devices 32, 33, 42, 43, 44, 52, 53, 54, and an adhesion device 34.

In the first processing unit 30, the washing device 31 is housed in the lowermost compartment of the stacked structure. Also, the compartments housing the cooling devices 32, 33, the adhesion device 34 and the baking devices 35, 36 are stacked in this order on the lowermost compartment. Transfer windows 31a to 36a are formed in the front wall of each of these compartments such that the wafers W can be transfer into and taken out of these compartments by the first main arm mechanism 37 through these transfer windows 31a to 36a.

The main arm mechanism 37 comprises three holders, i.e., uppermost holder 37a, intermediate holder 37b, and lowermost holder 37c, for directly holding the wafers W. Each of these holders 37a, 37b, 37c is supported by a driving mechanism (not shown), and is slidable along a base plate 37d such that these holders are independently movable forward and backward within an X-Y plane. The base plate 37d is supported by a vertical shaft 38 connected to a lift mechanism 39 and, thus, is movable in a Z-axis direction. Further, the main arm mechanism 37 is supported by a swing mechanism (not shown) so as to be swingable about the vertical shaft 38.

Figure 4:
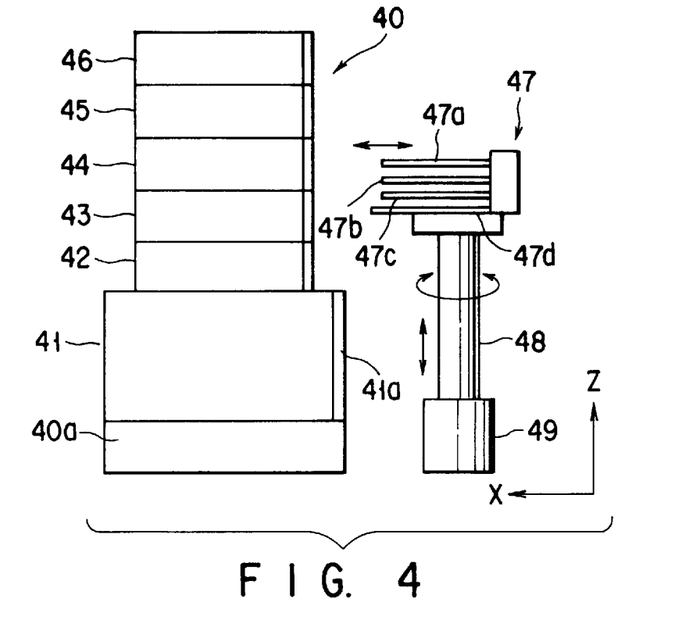
FIG. 4 is a side view showing the construction of the resist processing system of the present invention shown in FIG. 2 (first embodiment)

In the second processing unit 40, the resist coating device 41 is housed in the lowermost compartment of the stacked structure, as shown in FIG. 4. Also, the compartments housing the cooling devices 42, 43, 44, and the baking devices 45, 46 are stacked in this order on the lowermost compartment. Transfer windows 41a to 46a are formed in the front wall of each of these compartments as shown in FIG. 3 such that the wafers W can be transfer into and taken out of these compartments by the second main arm mechanism 47, which is substantially equal to the first main arm mechanism 37, through these transfer windows 41a to 46a.

A first relay section 11 is interposed between the first and second main arm mechanisms 37 and 47. A wafer table 12 for supporting the wafer W is arranged on the upper surface of the first relay section 11. Three supporting pins 13 project upward from the wafer table 12 for supporting the wafer W.

In the third processing unit 50, the developing device 51 is housed in the lowermost compartment of the stacked structure. Also, the compartments housing the cooling devices 52, 53, 54, and the baking devices 55, 56 are stacked in this order on the lowermost compartment. Transfer windows 51a to 56a are formed in the front wall of each of these compartments such that the wafers W can be transfer into and taken out of these compartments by the third main arm mechanism 57, which is substantially equal to the first main arm mechanism 37, through these transfer windows 51a to 56a.

A second relay section 14 is interposed between the second and third main arm mechanisms 47 and 57. The second relay section 14 is substantially equal to the first relay section 11. Specifically, a wafer table 15 for supporting the wafer W is arranged on the upper surface of the second relay section 14. Also, three supporting pins 16 project upward from the wafer table 15 for supporting the wafer W.

The resist processing system 1 of the construction described above is operated as follows. Specifically, the wafers W are taken out of the cassette C by the first sub-arm mechanism 22. On the other hand, the first main arm mechanism 37 is swung about the shaft 38 and, at the same time, the holder portion of the mechanism 37 is moved in the Z-axis direction. As a result, the lowermost holder 37c of the first main arm mechanism 37 is moved forward so as to receive the wafers W from the first sub-arm mechanism 22. It should be noted that the first main arm mechanism 37 is moved in the Z-axis direction while being swung so as to shorten the time required for the wafer transfer.

The first main arm mechanism 37 is moved again in the Z-axis direction while being swung so as to be positioned to face the compartment housing the washing device 31. Then, the lowermost holder 37c is moved forward so as to transfer the wafers W into the washing device 31 through the transfer window 31a. After the washing treatment within the washing device 31, the wafers W are taken out of the washing device 31 by the first main arm mechanism 37. Then, the wafers W are moved upward in the Z-axis direction by the first main arm mechanism 37, followed by transferring the wafers W into the baking device 35 for the baking treatment.

After the baking treatment, the wafers W are taken out of the baking device 35 by the uppermost holder 37a or intermediate holder 37b of the first main arm mechanism 37 so as to be transferred into the cooling device 34 for the cooling purpose. After the cooling, the wafers W are taken out of the cooling device 34 by the lowermost holder 37c of the first main arm mechanism 37 so as to be transferred onto the first relay section 11 such that the transferred wafers W are supported by the supporting pins 13 projecting upward from the wafer table 12.

In the next step, the second main arm mechanism 47 picks up the wafers W from the first relay section 11 so as to transfer these wafers W into the resist coating device 41 included in the second processing unit 40. After the resist coating treatment, the wafers W are taken out of the resist coating device 41 by the second main arm mechanism 47 and, then, transferred into the baking device 46 for the baking treatment. After the baking treatment, the wafers W are taken out of the baking device 46 by the second main arm mechanism 47 and, then, transferred into the cooling device 44 for the cooling treatment. After the cooling, the wafers W are taken out of the cooling device 44 by the lowermost holder 47c of the second arm mechanism 47 so as to be transferred onto the second relay section 14 such that these wafers W are supported by the supporting pins 16 projecting upward from the wafer table 15.

Further, the third main arm mechanism 57 picks up the wafers W from the second relay section 14 so as to transfer these wafers W onto the second sub-arm mechanism 23. Then, the second sub-arm mechanism 23 puts these wafers W on the wafer table 24 of the interface section 4. Further, a transfer mechanism (not shown) picks up the wafer W from the wafer table 24 and, then, transfers the wafer W into the exposure device (not shown) for the light-exposure treatment. After the light-exposure treatment, the transfer mechanism (not shown) puts again the wafer W on the wafer table 24 of the interface section 4. Still further, the second sub-arm mechanism 23 picks up the wafer W from the wafer table 24 of the interface section 4 and, then, transfers the wafer W onto the third main arm mechanism 57. The wafer W is further transferred by the third main arm mechanism 57 into the developing device 51 included in the third processing unit 50. In the developing device 51, a developing solution is applied to coated resist on the wafer W, which is kept rotated, for the developing purpose.

After the developing treatment, the third main arm mechanism 57 transfers the wafer W into the baking device 56 for the baking treatment. After the baking treatment, the third main arm mechanism 57 transfers the wafer W into the cooling device 54 for the cooling purpose. After the cooling, the third main arm mechanism 57 transfers the wafer W onto the second relay section 14 such that the wafer W is supported by the supporting pins 16 projecting upward from the wafer table 15.

Then, the second main arm mechanism 47 picks up the wafer W from the second relay section 14 for transfer of the wafer W onto the supporting pins 13 projecting upward from the wafer table 12 in the first relay section 11. Further, the first main arm mechanism 37 picks up the wafer W from the first relay section 11 for transfer of the wafer W into the first sub-arm mechanism 22. Finally, the wafer W is housed in the cassette C by the first sub-arm mechanism 22.

The series of the resist processing treatments described above are performed in parallel simultaneously, with the result that a plurality of wafers W are kept processed in parallel within the system 1.

In the processing system 1 of the embodiment described above, the wafers W immediately after treatment in the solution processing type devices 31, 41, 51 are promptly transferred in a very short time into the heat-treating type devices 32–36, 42–46, 52–56, leading to a marked improvement in through-put. Also, since the transfer distance of the wafer W is very short, the coated resist is less likely to be affected by the environment during transfer of the wafer, making it possible to perform a stable resist processing. Further, since any of the main arm mechanisms 37, 47, 57, which is required to be driven in the directions of X- and Z-axes and to be swingable about the Z-axis, is not driven in the Y-axis direction, the particle generation from these main arm mechanisms can be markedly suppressed, compared with the conventional main arm mechanism which is required to be driven in the Y-axis direction as well as in the directions of X- and Z-axes and to be swingable about the Z-axis.

It should also be noted that the solution processing type devices 31, 41, 51 are positioned below the heat-treating type devices 32–36, 42–46, 52–56, with the result that the solution processing type devices 31, 41, 51 are hardly affected thermally by the heat-treating type devices 32–36, 42–46, 52–56. As a result, a resist film of a uniform thickness can be coated with a high stability. In addition, the cooling devices 32, 33, 42–44, 52–54 included in the heat-treating type devices are positioned below the baking devices 35, 36, 45, 46, 55, 56 and the adhesion device 34, with the result that the transfer of the heat energy to the solution processing type devices 31, 41, 51 is inhibited. To be more specific, since the solution processing type devices 31, etc. are thermally insulated from the baking device 35, etc. by the cooling device 32, etc., the resist processing which is sensitive to temperatures can be performed satisfactorily.

Further, since the relay sections 11, 14 are interposed between the adjacent main arm mechanisms 37 and 47 and between the adjacent main arm mechanisms 47 and 57, respectively, for facilitating the wafer transfer, the wafers in each of the processing units 30, 40, 50 can be transferred smoothly into the adjacent processing unit for the next treatment so as to apply effectively the series of the treatments to the wafers W. Further, the relay sections 11 and 14 also act as interim waiting sections of the wafer W. It follows that the processing units 30, 40, 50 and the main arm mechanisms 37, 47, 57 can be operated efficiently so as to improve the through-put as a whole.

In the embodiment described above, each processing unit includes only one solution processing type device. However, each processing unit may be constructed to include two or three solution processing type devices which are stacked one upon the other. It should be noted in this connection that the solution processing type devices differ from each other in the time required for the processing depending on the kind of the solution processing type device. Therefore, it is important to consider the balance in the number of different solution processing type devices included in each processing unit.

Where a plurality of different solution processing type devices are included in a good balance in each processing unit, a high working rate of each processing device can be ensured, leading to a higher through-put.

Figure 5:
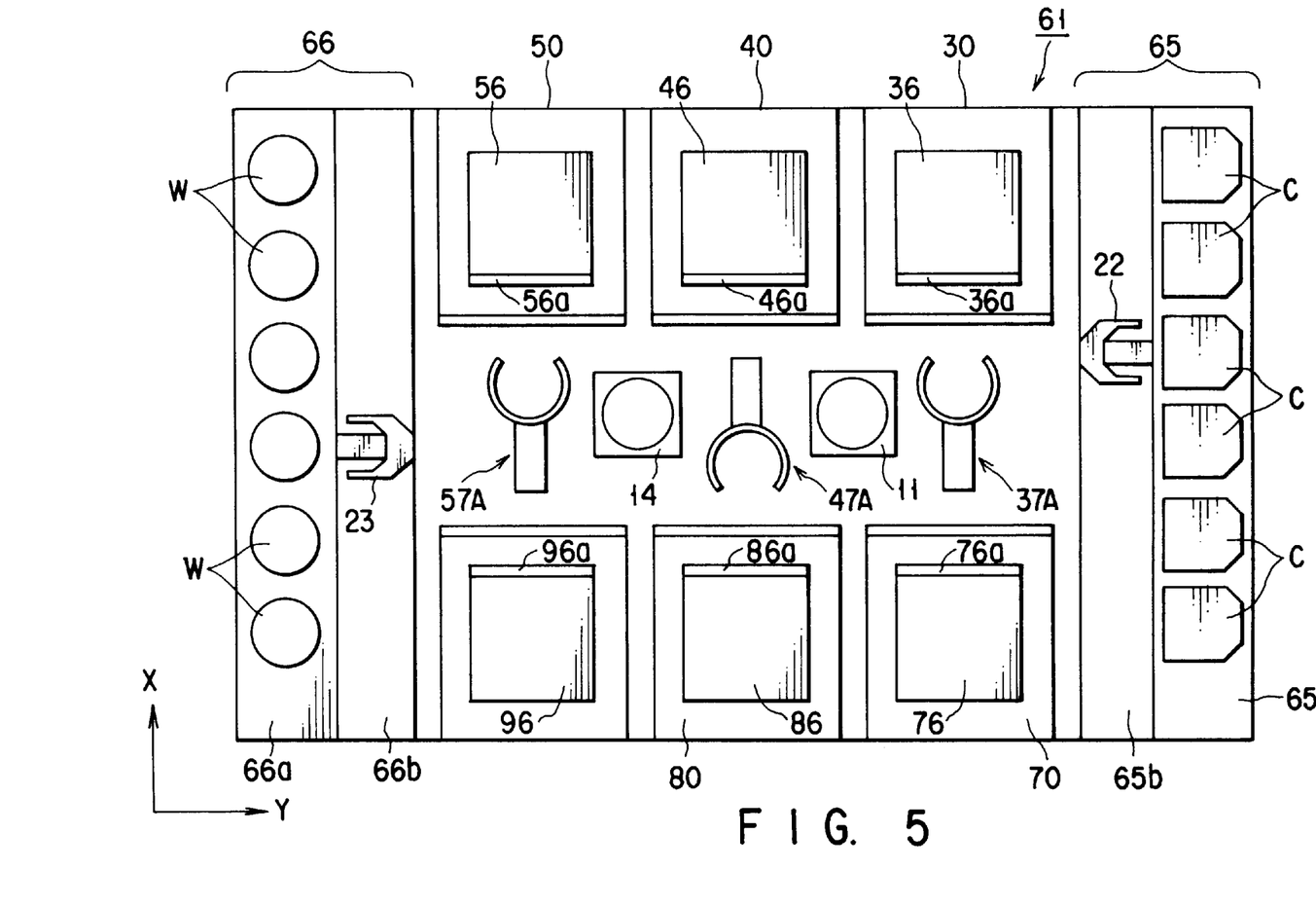
FIG. 5 is a plan view schematically showing the construction of the resist processing system according to a second embodiment of the present invention.
Figure 6:
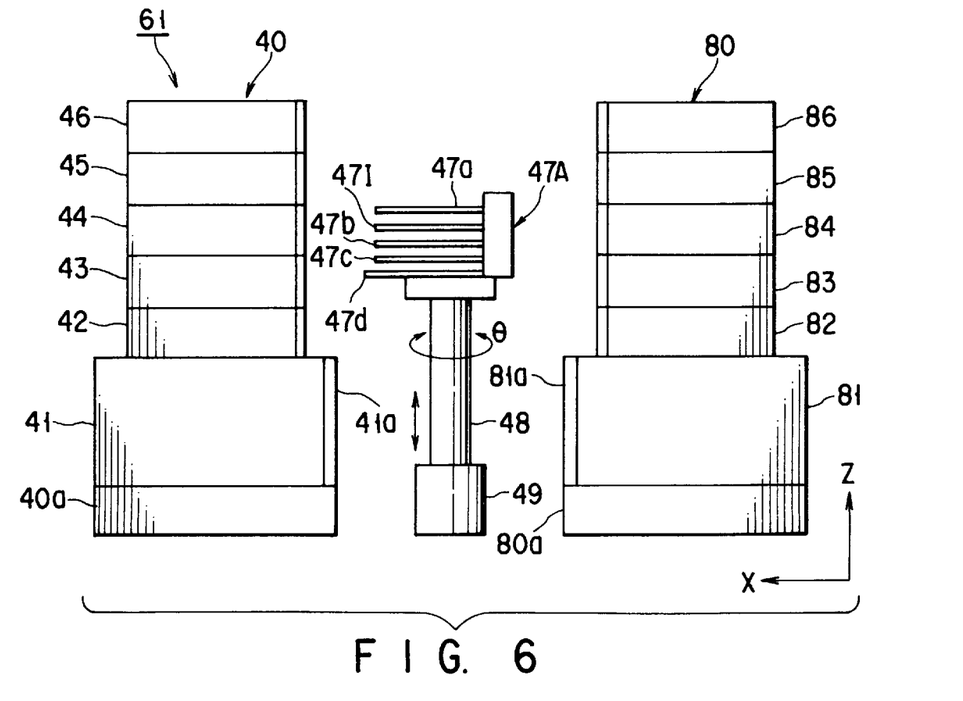
FIG. 6 is a side view showing the construction of the resist processing system of the present invention shown in FIG. 5 (second embodiment)

FIGS. 5 and 6 collectively show a resist processing system 61 according to a second embodiment of the present invention. In the following description of the second embodiment, the overlapping portion with the first embodiment is omitted.

As shown in FIG. 5, the resist processing system 61 comprises processing units of two groups, i.e., processing units 30, 40, 50 forming a first group, and processing units 70, 80, 90 forming a second group. These processing units 70, 80, 90 are arranged to face the processing units 30, 40, 50 with main arm mechanisms 37A, 47A, 57A interposed therebetween, respectively. These processing units 70, 80, 90 are substantially equal in construction to the processing units 30, 40, 50, respectively.

The main arm mechanisms 37A, 47A, 57A interposed between the processing units of the first group and those of the second group are substantially equal in construction to the main arm mechanisms 37, 47, 57 described previously in conjunction with the first embodiment, except that the main arm mechanisms 37A, 47A, 57A include heat insulating plates 371, 471, 571 which are interposed between the uppermost holders 37a, 47a, 57a and the intermediate holders 37b, 47b, 57b, respectively.

FIG. 6 exemplifies how the second main arm mechanism 47A is operated. As pointed out above, the uppermost holder 47a is thermally insulated from the intermediate holder 47b by the heat insulating plate 471. The uppermost holder 47a is used exclusively for transferring the wafer W into and out of the solution processing type devices 41 and 81. On the other hand, the intermediate holder 47b and the lowermost holder 47c are used exclusively for putting the wafer W into and out of the heat-treating type devices 42–46 and 82–86. In general, the intermediate holder 47b is allocated to the baking devices 45, 46, 85, 86, with the lowermost holder 47c being allocated to the cooling devices 42–44 and 82–84.

Also, the load/unload section 65 and the interface section 66 are enlarged in the resist processing system 61 according to the second embodiment of the present invention. It follows that the resist processing system 61 permits processing a larger number of wafers W per unit time, compared with the resist processing system 1 of the first embodiment.

Figure 7:
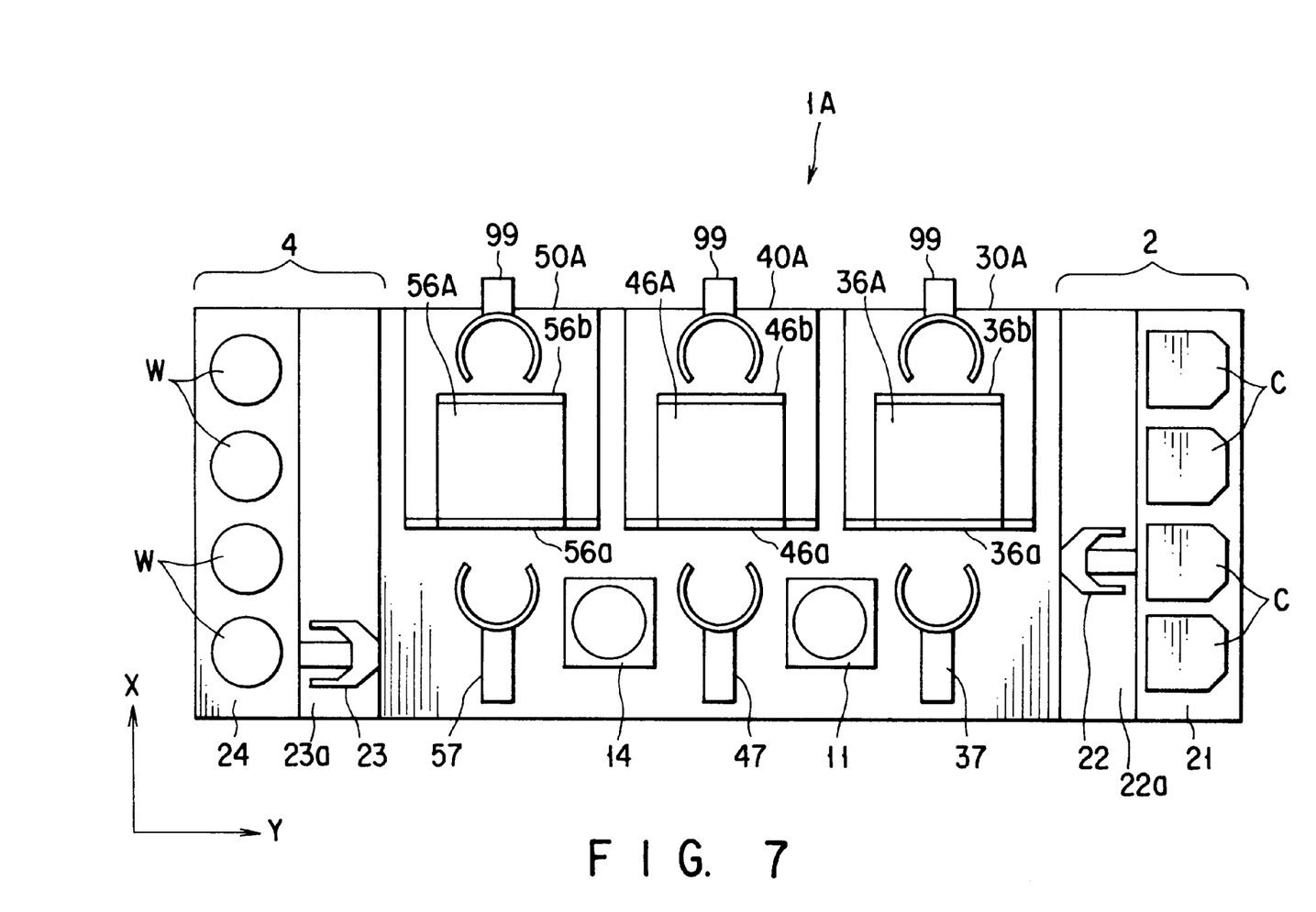
FIG. 7 is a plan view schematically showing the construction of the resist processing system according to a third embodiment of the present invention.
Figure 8:
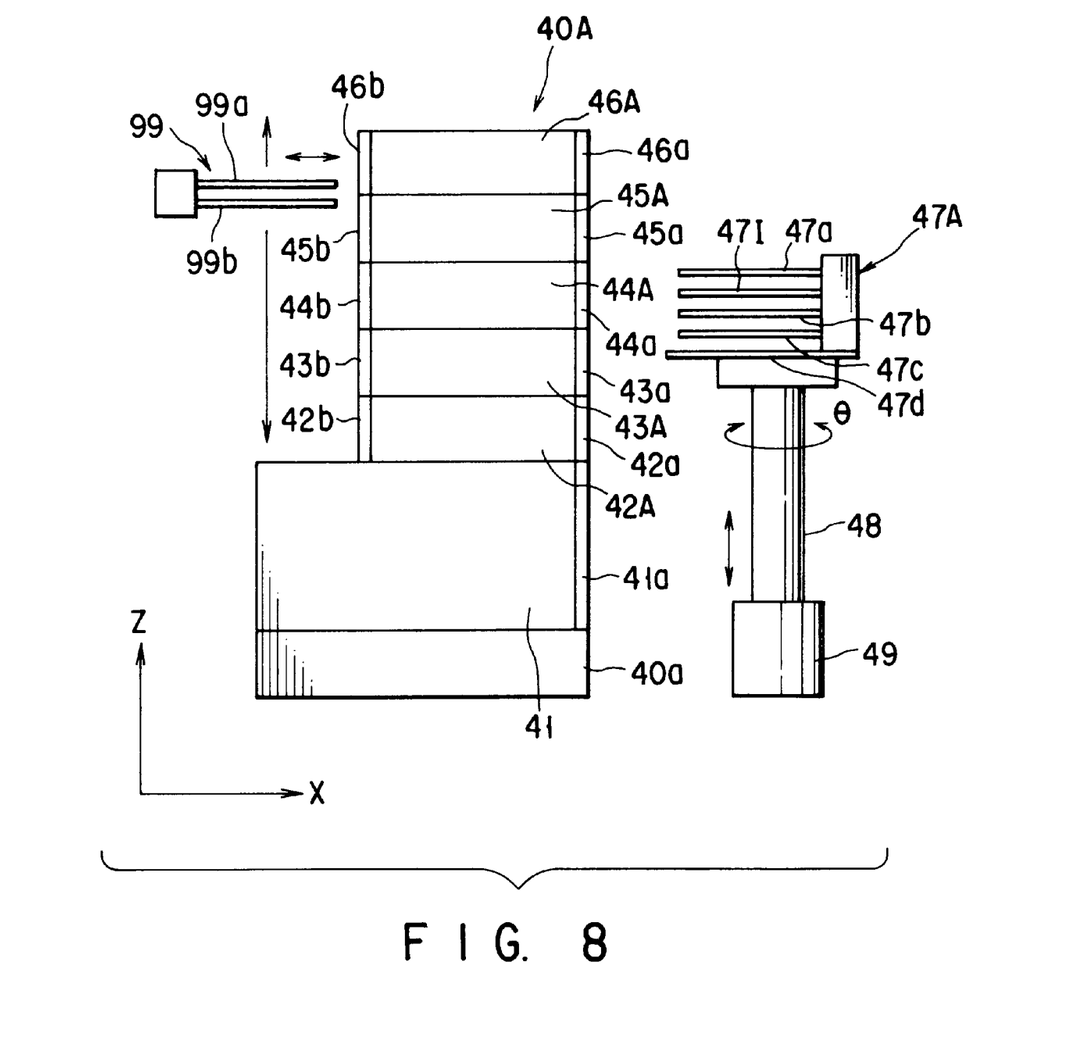
FIG. 8 is a side view showing the construction of the resist processing system of the present invention shown in FIG. 7 (third embodiment).

FIGS. 7 and 8 collectively show a resist processing system 1A according to a third embodiment of the present invention. In the following description of the third embodiment, the overlapping portion with the first and second embodiments is omitted.

As shown in FIG. 7, the resist processing system 1A of the third embodiment comprises processing units 30A, 40A, 50A and the main arm mechanisms 37, 47, 57. In addition, each of these processing units 30A, 40A, 50A is equipped with a sub-arm mechanism 99. The sub-arm mechanism 99 is substantially equal to the arm mechanism for the wafer transfer, which is disclosed in U.S. Pat. No. 5,620,560. Specifically, the sub-arm mechanism 99 comprises an upper holder 99a and a lower holder 99b, as shown in FIG. 8, as well as a holder driving mechanism (not shown) for horizontally driving these holders 99a, 99b and a lift mechanism (not shown) for vertically driving these holders 99a, 99b. As apparent from FIG. 8, the two holders 99a and 99b of the sub-arm mechanism 99 serve to transfer the wafer W into and out of the heat-treating type devices 42A to 46A alone.

Transfer windows 42a–46a, 52a–56a, 62a–66a are formed through the front walls of the compartments constituting the processing units 40A, 50A, 60A. Likewise, transfer windows 42b–46b, 52b–56b, 62b–66b are formed through the back walls of these compartments. When it comes to, for example, the processing unit 40A, the compartments housing the cooling devices 42A, 43A, 44A and the baking devices 45A, 46A, which are stacked on the resist coating device 41, are provided with the wafer transfer windows 42a, 43a, 44a, 45a, 46a formed through the front walls facing the main arm mechanism 47A and with the wafer transfer windows 42b, 43b, 44b, 45b, 46b formed through the back walls.

In general, a device utilizing a rotary mechanism for supplying a process solution such as the resist coating device 41 is sized larger than the cooling device or the heating device. In view of the particular situation, the front walls of the compartments housing the cooling devices 42A, 43A, 44A and the baking devices 45A, 46A are aligned with the front wall of the compartment housing the resist coating device 41 in the processing system 1A of the third embodiment. In other words, the transfer windows 42a, 43a, 44a, 45a, 46a for the compartments noted above are aligned with the transfer window 41a for the compartment housing the resist coating device 41. As a result, a free space is provided above the resist coating device 41 and behind the compartments housing the cooling devices 42A, 43A, 44A and the baking devices 45A, 46A. In the resist processing system 1A of the third embodiment, the sub-arm mechanism 99 is arranged in the free space noted above so as to effectively utilize the free space.

As shown in FIG. 8, the sub-arm mechanism 99 is arranged behind the processing unit 40A and is provided with an upper holder 99a and a lower holder 99b which are exclusively used for transferring the wafer W into and out of the compartments stacked on the compartment housing the resist coating device 41. The sub-arm mechanism 99 is movable in the Z-axis direction to cover the stacked compartments including the uppermost compartment housing the baking device 46A and the compartment disposed directly on the compartment housing the resist coating device 41, i.e., the compartment housing the cooling device 42A. Also, the two holders 99a and 99b of the sub-arm mechanism 99 can be moved forward or backward alternately or simultaneously.

The wafer W after the heat treatment in, for example, the baking devices 45A, 46A is transferred by the sub-arm mechanism 99 into the cooling devices 42A, 43A, 44A for the subsequent cooling treatment. As a result, the load of the main arm mechanism 47A is lessened, making it possible to utilize the main arm mechanism 47A for another transfer process. It follows that the through-put is increased. In addition, the function performed by the sub-arm mechanism 99 permits simplifying the operation of the main arm mechanism 47A so as to suppress the particle generation. On the other hand, the sub-arm mechanism 99 need not be swung about the Z-axis, leading to a further simplified operation and, thus, to a markedly suppressed particle generation. It follows that the particle generation in the entire system 1A can be further suppressed.

The sub-arm mechanism 99 is also arranged behind each of the processing units 30A and 50A, making it possible to operate efficiently the main arm mechanisms 37 and 57 for these processing units 30A and 50A, respectively. As a result, the through-put of the entire system 1A can be markedly improved.

Needless to say, the sub-arm mechanism 99 of the particular construction can also be used in the resist processing system 61 shown in FIG. 5. Incidentally, it is possible for the sub-arm mechanism 99 to be provided with a single holder.

In any of the embodiments described above, various treatments are applied to a semiconductor wafer. However, other substrates such as a glass substrate for an LCD device can also be processed by the resist processing system of the present invention.

As described above in detail, the resist processing system of the present invention permits improving the through-put in, particularly, the heat-treating steps, compared with the conventional system. Also, the particle generation can be much suppressed, compared with the conventional system. Further, the processing system including both solution processing type devices and heat-treating type devices can be formed without difficulty. In this case, the solution processing type devices are prevented from being thermally affected by the heat-treating type devices so as to carry out the desired solution processing satisfactorily and with a high safety.

Various solution processing type devices can be incorporated in the resist processing system of the present invention. Also, a series of solution processing and heat treatments can be consecutively applied effectively to the substrate transferred from the load/unload section and, after completion of these treatments, the substrate can be brought back to the load/unload section.

Further, the substrates having various treatments applied thereto in a processing unit can be transferred smoothly to another processing unit so as to carry out a series of treatments effectively. In addition, the relay section included in the resist processing system of the present invention can be used as an interim waiting position. Still further, the load of the main arm mechanism can be lessened so as to improve the through-put.

It should be noted that a resist solution is likely to be affected by temperatures, with the result that the thickness of the resist film tends to be promptly affected by temperatures. It follows that it is difficult to obtain a desired film thickness by simply disposing a heat-treating type device at an end and stacking solution processing type devices such as a resist coating device one upon the other. In the present invention, however, the heating devices and solution processing devices are arranged in the upper and lower stages, respectively, with the cooling devices arranged in the intermediate stage. It follows that the cooling devices arranged in the intermediate stage serve to prevent the solution processing devices from being thermally affected by the heating devices.

Also, a series of solution processing and heat treatments can be consecutively applied effectively to the substrate and, after completion of these treatments, the substrate can be brought back to the load/unload section. Further, a sub-arm mechanism is used for simply transferring the substrate within the heat-treating device to a cooling device so as to lessen the load of the main arm mechanism and to improve the through-put. Still further, since the sub-arm mechanism is exclusively used for the simple transfer operation noted above, it is possible to suppress contamination of the substrate caused by, for example, attachment of the process solution to the substrate, compared with the conventional system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed:

1. A resist processing system, comprising:
    a plurality of processing units each having a plurality of compartments stacked one upon the other in a vertical direction;
    a solution processing device arranged in a compartment positioned in a lower portion of one of said processing units for applying a process solution to a substrate while rotating said substrate;
    a heating device arranged in a compartment positioned in an upper portion of the one processing unit for heating the substrate;
    a cooling device arranged in an intermediate positioned compartment between the compartment having said heating device arranged therein and the compartment having said solution processing device arranged therein for cooling the substrate said cooling device thermally insulating said heating device from the solution processing device to prevent heat generated in the heating device from being transmitted to the solution processing device; and
    a main arm mechanism arranged in each of said processing units and provided with a plurality of holders for transferring the substrate into and out of each compartment, said holders being movable into and out of each of the compartments included in the processing units, movable in a Z-axis direction, and swingable about the Z-axis by an angle θ.

2. The resist processing system according to claim 1, further comprising a relay section arranged between said main arm mechanisms for transfer of the substrate from one main arm mechanism to the other main arm mechanism.

3. The resist processing system according to claim 1, further comprising a sub-arm mechanism arranged for each of the processing units, movable toward and away from the heating device and the cooling device included in the same processing unit, movable in a Z-axis direction, and being equipped with a plurality of holders for transferring the substrate from the heating device to the cooling device within the same processing unit.

4. The resist processing system according to claim 3, wherein said sub-arm mechanism is adapted to transfer said substrate in and out of said heating and cooling devices in directions opposite to those of the main arm mechanism.

5. The resist processing system according to claim 3, wherein the compartment housing the heating device has two substrate transfer openings, and the compartment housing the cooling device also has two substrate transfer openings.

6. The resist processing system according to claim 1, wherein said plural processing units are arranged in series.

7. A resist processing system, comprising:
    a process section for applying a resist treatment to a substrate; and
    a load/unload section for loading/unloading the substrate into/out of said process section;
    said process section including:
        a plurality of processing units each having a plurality of compartments stacked one upon the other in a vertical direction;
        a solution processing device arranged in a compartment positioned in a lower portion of one of said processing units for applying a process solution to the substrate while rotating said substrate;

a heating device arranged in a compartment positioned in an upper portion of the one processing unit for heating the substrate;

a cooling device arranged in an intermediate compartment positioned between the compartment having said heating device arranged therein and the compartment having said solution processing device arranged therein for cooling the substrate said cooling device thermally insulating said heating device from the solution processing device to prevent heat generated in the heating device from being transmitted to the solution processing device; and a main arm mechanism arranged in each of said processing units and provided with a plurality of holders for transferring the substrate into and out of each compartment, said holders being movable into and out of each of the compartments included in the processing units, movable in a Z-axis direction, and swingable about the Z-axis by an angle θ, at least one of said main arm mechanisms serving to transfer the substrate between the load/unload section and the processing unit.

8. The resist processing system according to claim 7, further comprising a relay section arranged between said main arm mechanisms for transfer of the substrate from one main arm mechanism to the other main arm mechanism.

9. The resist processing system according to claim 7, further comprising a sub-arm mechanism arranged for each of the processing units, movable toward and away from the heating device and the cooling device included in the same processing unit, movable in a Z-axis direction, and being equipped with a plurality of holders for transferring the substrate from the heating device to the cooling device within the same processing unit.

10. The resist processing system according to claim 9, wherein said sub-arm mechanism is adapted to transfer said substrate in and out of said heating and cooling devices in directions opposite to those of the main arm mechanism.

11. The resist processing system according to claim 9, wherein the compartment housing the heating device has two substrate transfer openings, and the compartment housing the cooling device also has two substrate transfer openings.

12. The resist processing system according to claim 7, wherein said plural processing units are arranged in series.

13. The resist processing system according to claim 1, wherein a solution processing device, a heating device and a cooling device are arranged in each of said processing units.

14. The resist processing system according to claim 7, wherein a solution processing device, a heating device and a cooling device are arranged in each of said processing units.

15. A resist processing system, comprising:

a plurality of processing units each having a stack comprising a plurality of compartments stacked one upon the other in a vertical direction;

a solution processing device arranged in a compartment positioned in a first compartment of a stack in one of said processing units;

a heating device arranged in a second compartment positioned over said first compartment in said stack in said one processing unit;

a cooling device arranged in a third compartment disposed between the first and second compartments in said stack of said one processing unit; and a main arm mechanism arranged in each of said processing units and provided with a plurality of holders for transferring the substrate into and out of compartments in respective ones of said stacks.

16. The resist processing system according to claim 15, comprising:

said cooling device thermally insulating said heating device from the solution processing device to prevent heat generated in the heating device from being transmitted to the solution processing device.

17. The resist processing system according to claim 15, comprising:

said holders being movable into and out of each of the compartments included a stack of each of said processing units, movable in a Z-axis direction, and swingable about the Z-axis by an angle θ.

18. The resist processing system according to claim 15, wherein said stack in said one processing device comprises:

a plurality of heating devices arranged in upper compartments of said stack in said one processing unit; and a plurality of cooling devices arranged in compartments disposed between said plurality of heating devices and said solution processing device in said stack of said one processing unit.

19. The resist processing system according to claim 15, wherein a solution processing device, a heating device and a cooling device are arranged in each of said processing units.

* * * * *